(12) United States Patent
Oasa

(10) Patent No.: US 11,869,970 B2
(45) Date of Patent: Jan. 9, 2024

(54) SEMICONDUCTOR DEVICE INCLUDING ENERGY LEVEL IN DRIFT LAYER

(71) Applicants: KABUSHIKI KAISHA TOSHIBA, Tokyo (JP); TOSHIBA ELECTRONIC DEVICES & STORAGE CORPORATION, Tokyo (JP)

(72) Inventor: Kohei Oasa, Setagaya (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 111 days.

(21) Appl. No.: 17/470,626

(22) Filed: Sep. 9, 2021

(65) Prior Publication Data
US 2022/0302307 A1    Sep. 22, 2022

(30) Foreign Application Priority Data
Mar. 19, 2021    (JP) .................... 2021-045548

(51) Int. Cl.
| | | |
|---|---|---|
| H01L 29/78 | (2006.01) | |
| H01L 27/06 | (2006.01) | |
| H01L 29/66 | (2006.01) | |
| H01L 29/423 | (2006.01) | |

(52) U.S. Cl.
CPC ...... H01L 29/7827 (2013.01); H01L 27/0629 (2013.01); H01L 29/4236 (2013.01); H01L 29/66666 (2013.01)

(58) Field of Classification Search
CPC ............ H01L 29/7827; H01L 27/0629; H01L 29/4236; H01L 29/66666; H01L 21/263; H01L 29/0873; H01L 29/32; H01L 29/41; H01L 29/42376; H01L 29/407; H01L 29/66734; H01L 29/7813; H01L 29/7803
USPC ............................................... 257/330
See application file for complete search history.

(56) References Cited

U.S. PATENT DOCUMENTS

| | | | | |
|---|---|---|---|---|
| 7,977,742 | B1 * | 7/2011 | Disney | H01L 29/66734 257/E29.257 |
| 8,558,308 | B1 | 10/2013 | Blank et al. | |
| 8,659,052 | B2 * | 2/2014 | Ikeda | H01L 21/8249 257/370 |
| 10,014,368 | B2 | 7/2018 | Iwasaki et al. | |

(Continued)

FOREIGN PATENT DOCUMENTS

| | | |
|---|---|---|
| JP | 2004-133698 A | 4/2004 |
| JP | 2011-49229 A | 3/2011 |

(Continued)

*Primary Examiner* — Mohammad M Hoque
(74) *Attorney, Agent, or Firm* — Allen & Overy LLP

(57) ABSTRACT

A semiconductor device includes an upper electrode; a lower electrode; a substrate positioned between the upper electrode and the lower electrode; a buried electrode part positioned between the substrate and the upper electrode, the buried electrode part including a gate electrode; and a silicon layer positioned between the substrate and the upper electrode. The silicon layer includes a mesa part next to the buried electrode part, a first region positioned between the mesa part and the substrate, and a second region positioned between the buried electrode part and the substrate. An energy level density of the first region is greater than an energy level density of the second region.

6 Claims, 5 Drawing Sheets

(56) References Cited

U.S. PATENT DOCUMENTS

| | | | |
|---|---|---|---|
| 10,615,291 B2 | 4/2020 | Kimura | |
| 2009/0032851 A1* | 2/2009 | Pfirsch | H01L 21/221 |
| | | | 257/E21.135 |
| 2019/0096989 A1* | 3/2019 | Yoshida | H01L 29/66348 |
| 2020/0043823 A1* | 2/2020 | Nagaoka | H01L 29/7802 |
| 2020/0203513 A1* | 6/2020 | Konrath | H01L 29/0696 |

FOREIGN PATENT DOCUMENTS

| | | |
|---|---|---|
| JP | 2012-62749 A | 3/2012 |
| JP | 2015-144232 A | 8/2015 |
| JP | 2018-6420 A | 1/2018 |
| JP | 2018-11030 A | 1/2018 |
| JP | 2018-182080 A | 11/2018 |

* cited by examiner

SEMICONDUCTOR DEVICE INCLUDING ENERGY LEVEL IN DRIFT LAYER

CROSS-REFERENCE TO RELATED APPLICATION

This application is based upon and claims the benefit of priority from Japanese Patent Application No. 2021-045548, filed on Mar. 19, 2021; the entire contents of which are incorporated herein by reference.

FIELD

Embodiments described herein relate generally to a semiconductor device and a method for manufacturing a semiconductor device.

BACKGROUND

A MOSFET (Metal-Oxide-Semiconductor Field Effect Transistor) includes a built-in diode in addition to the MOSFET operation part. Improving the reverse recovery characteristics of the built-in diode can contribute to the efficiency of the circuit. In a known method of improving the reverse recovery characteristics of the built-in diode, the lifetime of carriers in the drift layer are controlled by irradiating high-energy particles.

DETAILED DESCRIPTION

Figure 1:
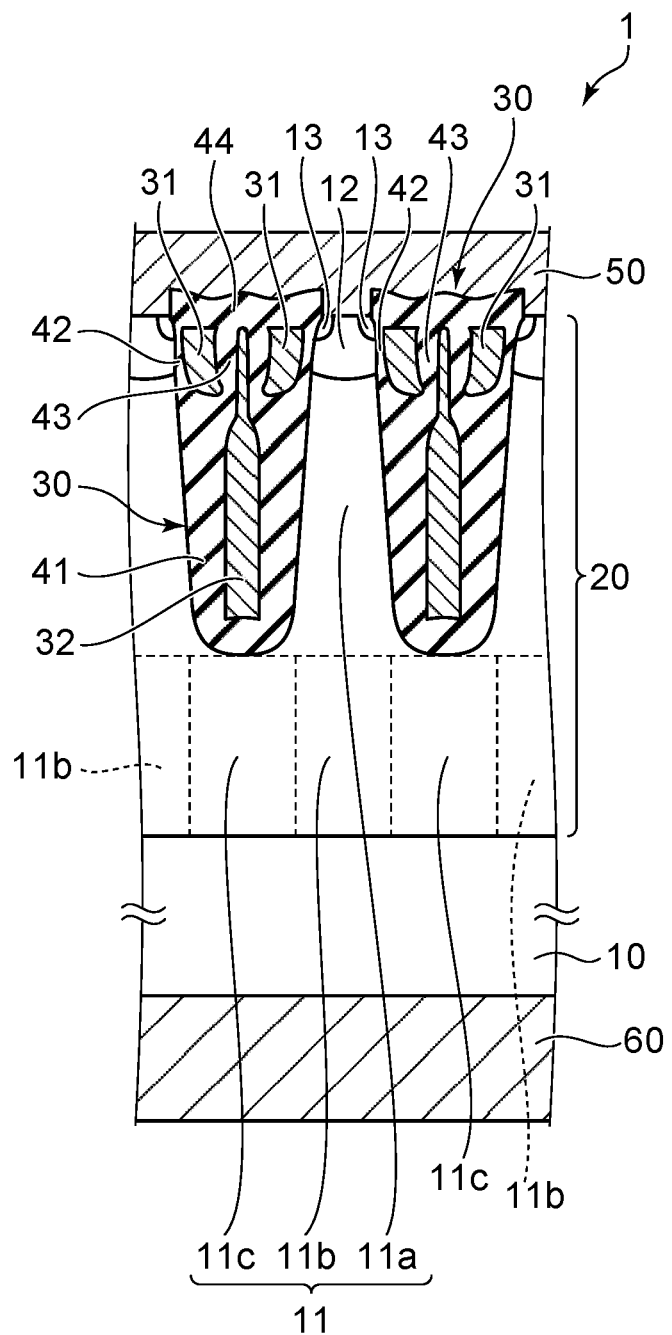
FIG. 1 is a schematic cross-sectional view of a semiconductor device of an embodiment.

According to one embodiment, a semiconductor device includes an upper electrode; a lower electrode; a substrate positioned between the upper electrode and the lower electrode; a buried electrode part positioned between the substrate and the upper electrode, the buried electrode part including a gate electrode; and a silicon layer positioned between the substrate and the upper electrode. The silicon layer includes a mesa part next to the buried electrode part, a first region positioned between the mesa part and the substrate, and a second region positioned between the buried electrode part and the substrate. An energy level density of the first region is greater than an energy level density of the second region.

Embodiments will now be described with reference to the drawings. The same components in the drawings are marked with the same reference numerals. Although a first conductivity type is described as an n-type and a second conductivity type is described as a p-type in embodiments described below, the first conductivity type may be the p-type, and the second conductivity type may be the n-type.

FIG. 1 is a schematic cross-sectional view of a semiconductor device 1 of an embodiment.

The semiconductor device 1 includes an upper electrode 50, a lower electrode 60, a substrate 10 that is positioned between the upper electrode 50 and the lower electrode 60, a buried electrode part 30 that is positioned between the substrate 10 and the upper electrode 50 and includes a gate electrode 31, and a silicon layer 20 that is positioned between the substrate 10 and the upper electrode 50. The semiconductor device 1 is a vertical semiconductor device in which a current is caused to flow in a direction (the vertical direction) connecting the upper electrode 50 and the lower electrode 60 by a control of the gate electrode 31.

The silicon layer 20 is located on the substrate 10. The lower electrode 60 is located at the back surface of the substrate 10. The substrate 10 is a silicon substrate. Multiple trenches are formed in the silicon layer 20; and the buried electrode parts 30 are located in the trenches. The silicon layer 20 includes multiple mesa parts 11a next to the buried electrode parts 30. The mesa parts 11a that are next to the trenches also are formed by forming the trenches in the silicon layer 20. The trenches do not reach the substrate 10.

For example, the buried electrode part 30 and the mesa part 11a extend in stripe shapes in a direction extending through the page surface in FIG. 1. Or, the buried electrode part 30 (the trench) may have a circular columnar or hexagonal prism shape.

The silicon layer 20 includes a drift layer 11, a base layer 12, and a source layer 13 that are located on the substrate 10. The conductivity types of the substrate 10 and the drift layer 11 are the n-type. The n-type impurity concentration of the drift layer 11 is less than the n-type impurity concentration of the substrate 10.

The mesa part 11a includes a portion of the drift layer 11, the p-type base layer 12 that is located on the portion of the drift layer 11, and the n-type source layer 13 that is located at the front surface of the base layer 12. The n-type impurity concentration of the source layer 13 is greater than the n-type impurity concentration of the drift layer 11.

The drift layer 11 also includes a first region 11b that is positioned between the mesa part 11a and the substrate 10, and a second region 11c that is positioned between the buried electrode part 30 and the substrate 10. The first region 11b is positioned below the mesa part 11a; and the second region 11c is positioned below the buried electrode part 30. The first region 11b and the second region 11c are continuous in the direction (the lateral direction) in which the buried electrode part 30 and the mesa part 11a are next to each other. The boundary between the first region 11b and the second region 11c is illustrated by a broken line for convenience of description in FIG. 1.

For example, two gate electrodes 31 are located in one buried electrode part 30. Each of the gate electrodes 31 faces the side surface of the base layer 12 via a gate insulating film 42. The gate insulating film 42 is located between the gate electrode 31 and the side surface of the base layer 12.

An n-type channel (an inversion layer) can be formed in the portion of the base layer 12 that faces the gate electrode 31 by applying a voltage that is not less than a threshold to the gate electrode 31.

The buried electrode part 30 also includes a field plate electrode 32. The field plate electrode 32 is positioned at substantially the width-direction (lateral-direction) center of the buried electrode part 30. The field plate electrode 32 extends through the buried electrode part 30 below the gate electrode 31. Compared to the bottom portion of the gate electrode 31, the bottom portion of the field plate electrode 32 is more proximate to the substrate 10. Although the buried electrode part 30 includes the gate electrode 31 and the field plate electrode 32 according to the embodiment, the buried electrode part 30 may include the gate electrode 31 without including the field plate electrode 32.

An insulating film 41 is located between the field plate electrode 32 and the drift layer 11. An insulating film 43 is located between the field plate electrode 32 and the gate electrode 31.

For example, the field plate electrode 32 is electrically connected with the upper electrode 50. Or, the field plate electrode 32 may be electrically connected with the gate electrode 31. The field plate electrode 32 relaxes the distribution of the electric field of the drift layer 11 in the off-state in which the application of the voltage that is not less than the threshold to the gate electrode 31 is stopped.

The upper electrode 50 is located on the buried electrode part 30 and on the mesa part 11a. An insulating film 44 is located between the gate electrode 31 and the upper electrode 50 and between the field plate electrode 32 and the upper electrode 50. The upper electrode 50 contacts the upper surface of the mesa part 11a (the upper surface of the source layer 13 and the upper surface of the base layer 12). Or, a structure may be used in which the upper electrode 50 contacts the side surface of the source layer 13 by a portion of the upper electrode 50 being located in a recess that is formed at the upper surface of the mesa part 11a.

A method for manufacturing the semiconductor device 1 will now be described.

Figure 2:
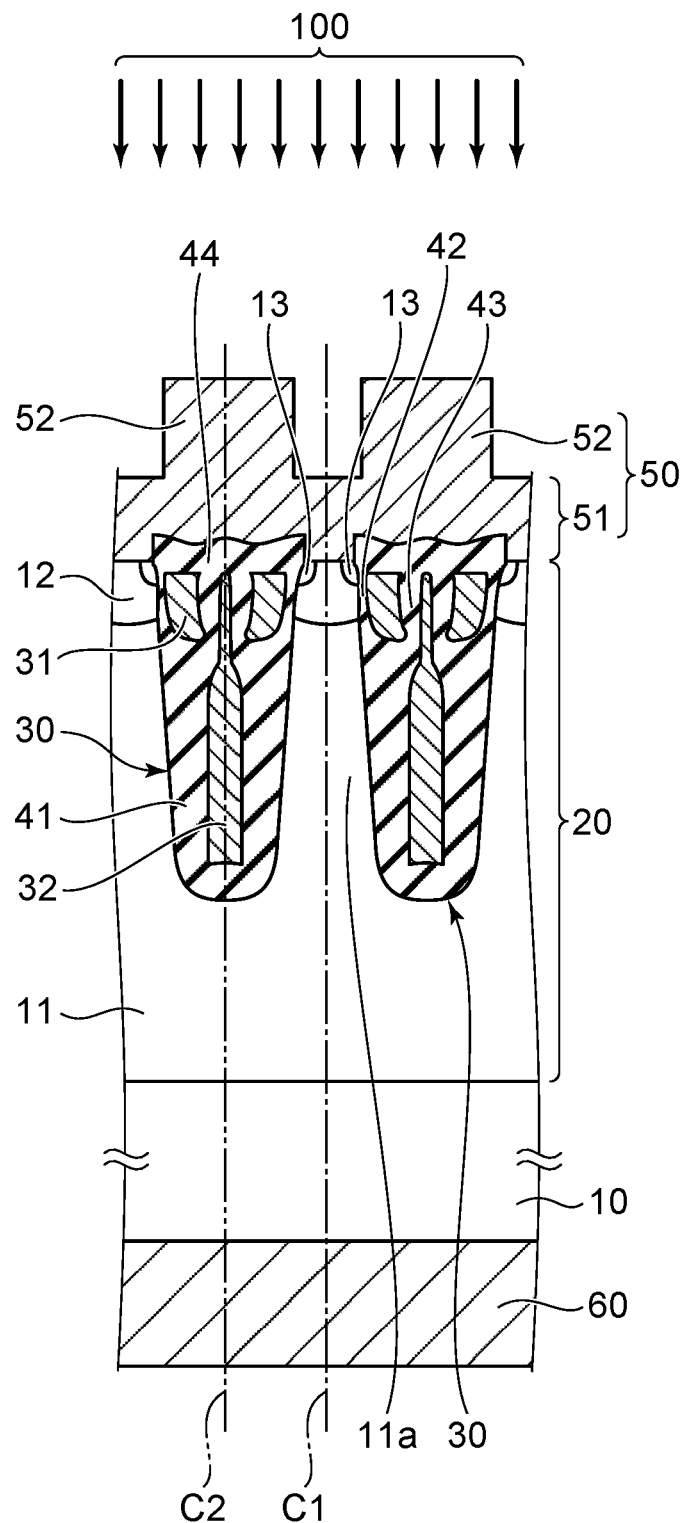
FIG. 2 is a schematic cross-sectional view showing a method for manufacturing the semiconductor device of the embodiment.

After forming the silicon layer 20 and the buried electrode part 30 on the substrate 10, the upper electrode 50 is formed on the buried electrode part 30 and on the mesa part 11a as shown in FIG. 2. At this time, the upper electrode 50 includes a first portion 51 that is positioned on the mesa part 11a, and a second portion 52 that is positioned on the buried electrode part 30.

The thickness of the second portion 52 (the shortest distance between the upper surface of the insulating film 44 of the buried electrode part 30 and the upper surface of the second portion 52) is greater than the thickness of the first portion 51 (the shortest distance between the upper surface of the mesa part 11a and the upper surface of the first portion 51). An unevenness is formed in the upper surface of the upper electrode 50. For example, the upper electrode 50 is formed of Cu by plating. Or, the material of the upper electrode 50 may be Al.

Energetic particles 100 are irradiated through the upper electrode 50 side by using the upper electrode 50 that has such a film thickness difference as a mask. The energetic particles 100 are protons or electrons.

The energetic particles 100 pass through the mesa part 11a and the first portion 51 of the upper electrode 50 and reach a region of the drift layer 11 under the mesa part 11a. Thereby, an energy level (a lifetime killer) that forms a recombination center of electrons and holes is formed in the first region 11b under the mesa part 11a shown in FIG. 1. In a reverse recovery operation in which a reverse bias is applied to the built-in diode of the semiconductor device 1 (the P-I-N diode that includes the base layer 12, the drift layer 11, and the substrate 10), one of the carriers (an electron or a hole) that remains in the drift layer 11 is trapped in the energy level formed in the first region 11b and recombines with the other carrier. The reverse recovery charge of the built-in diode is reduced thereby, and the reverse recovery characteristics can be improved. The first region 11b functions as a lifetime control region in the reverse recovery operation of the built-in diode.

On the other hand, the energetic particles can be prevented from reaching the buried electrode part 30 because the second portion 52 of the upper electrode 50 on the buried electrode part 30 is thicker than the first portion 51. Accordingly, the energy level density of the first region 11b under the mesa part 11a is greater than the energy level density of the second region 11c under the buried electrode part 30. For example, the energy level is measurable using PL (photoluminescence). Also, the defect density of the silicon crystal of the first region 11b is greater than the defect density of the silicon crystal of the second region 11c. When protons are irradiated as the energetic particles, the hydrogen concentration of the first region 11b becomes greater than the hydrogen concentration of the second region 11c.

When high-energy particles are irradiated on an insulating film, defects are formed in the insulating film, which may cause fluctuation of the threshold, fluctuation of the breakdown voltage, and a reduction of the insulation reliability of the insulating film. Conversely, according to the embodiment, the energetic particles can be prevented from reaching the buried electrode part 30 by utilizing the film thickness difference of the upper electrode 50. Accordingly, defects in the gate insulating film 42 and the insulating films 41, 43, and 44 of the buried electrode part 30 can be suppressed. According to such an embodiment, a highly-reliable semiconductor device can be provided while improving the reverse recovery characteristics of the built-in diode. It is unnecessary to anneal after irradiating the energetic particles in order to repair defects in the insulating films of the buried electrode part 30. Characteristic fluctuation due to annealing can be prevented thereby, and the processes can be reduced.

According to the embodiment, the processes are not complex because the energy level can be locally formed in the first region 11b under the mesa part 11a by providing the film thickness difference in the upper electrode 50 that is one component of the semiconductor device 1.

It is desirable to planarize the upper surface of the upper electrode 50 from the perspective of providing an easy connection between the upper electrode 50 and the external circuit after irradiating the energetic particles, etc. Planarization may be performed to align with the upper surface of the first portion 51; or planarization may be performed by filling a metal material into the recesses between the second portions 52. Or, an unevenness such as that shown in FIG. 2 may remain as-is in the upper surface of the upper electrode 50 without planarizing the upper surface of the upper electrode 50.

Figure 3:
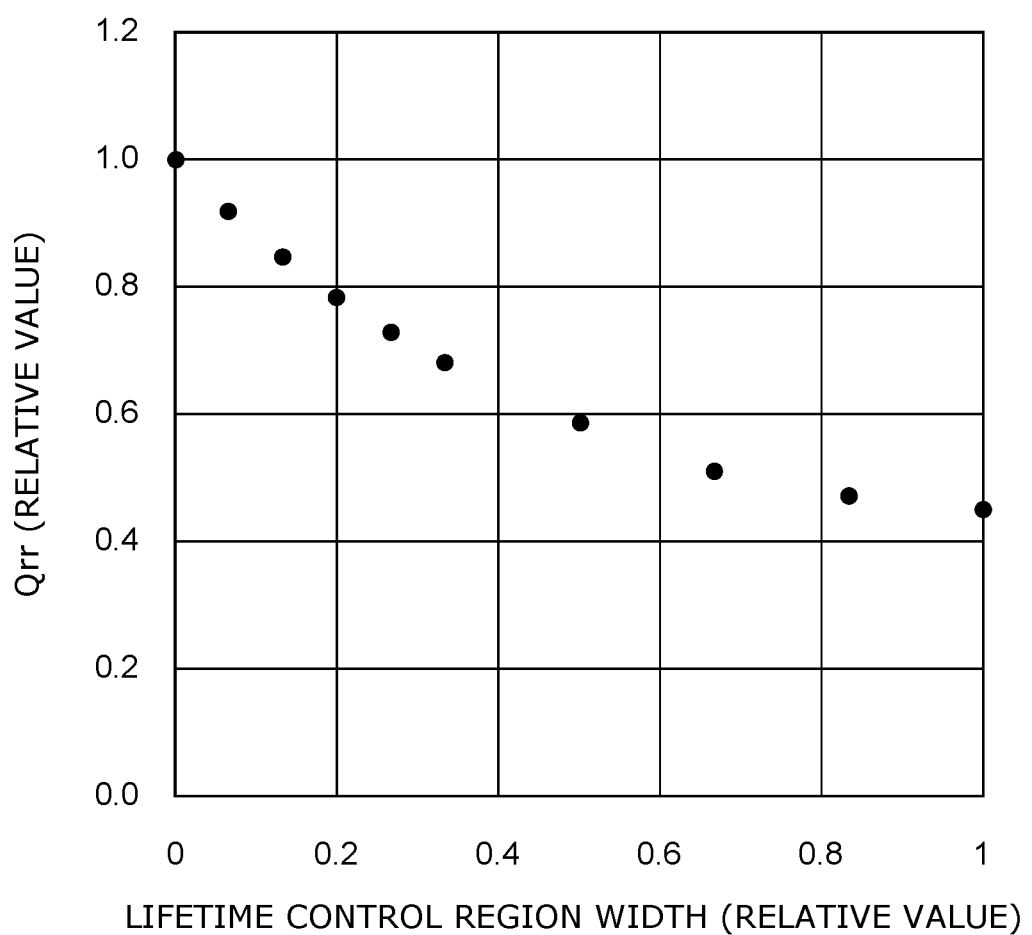
FIG. 3 is a graph illustrating simulation results of a dependence of a reverse recovery charge Qrr on a width of a lifetime control region.

FIG. 3 is a graph illustrating simulation results of the dependence of a reverse recovery charge Qrr on the width of the lifetime control region.

The horizontal axis of the graph of FIG. 3 is the width in the direction from the starting point of a center C1 in the width direction of the mesa part 11a of FIG. 2 toward a center C2 in the width direction of the buried electrode part 30, and is a relative value when the width (the distance) from the center C1 to the center C2 is taken to be 1. The reverse recovery charge Qrr of the vertical axis is a relative value when Qrr is taken to be 1.0 when the width of the lifetime control region is 0, that is, when the energy level is not formed in the drift layer 11.

The width from the center C1 of the mesa part 11a shown in FIG. 2 to the edge of the region under the buried electrode part 30 corresponds to a width of the lifetime control region of 0.5 in the graph of FIG. 3. In other words, compared to when the width of the lifetime control region is 0, Qrr can be sufficiently reduced merely by forming the energy level locally in the region under the mesa part 11a even without forming the energy level under the buried electrode part 30.

The film thickness of the first portion 51 and the film thickness of the second portion 52 of the upper electrode 50 are determined according to the type of metals included in the upper electrode 50, the type of the irradiated energetic particles, and the irradiation energy.

Figure 4A:
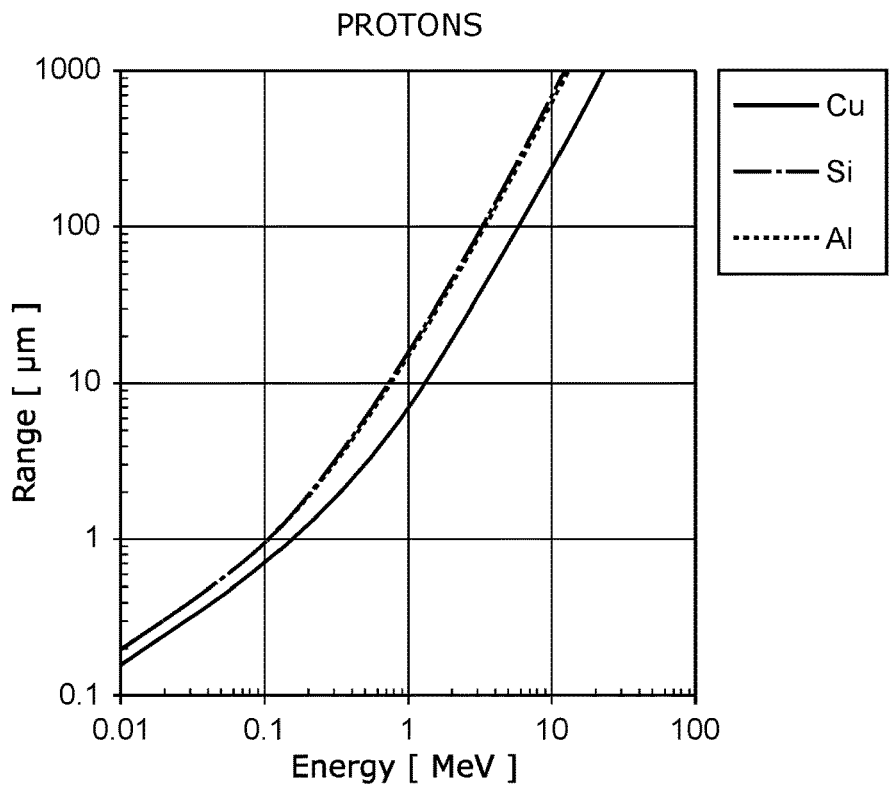
FIG. 4A is a graph showing a relationship between an irradiation energy of protons and a transmission range.
Figure 4B:
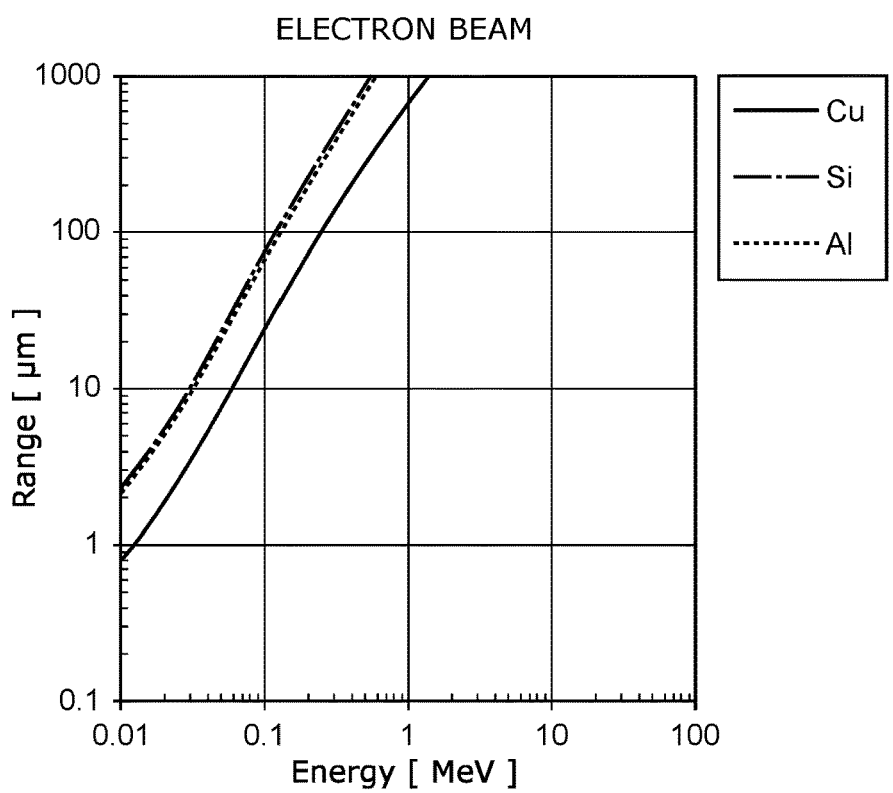
FIG. 4B is a graph showing a relationship between an irradiation energy of an electron beam and a transmission range.

FIG. 4A is a graph showing the relationship between the irradiation energy of protons (the horizontal axis) and the transmission range (the vertical axis). FIG. 4B is a graph showing the relationship between the irradiation energy of an electron beam (the horizontal axis) and the transmission range (the vertical axis). In the graphs of FIGS. 4A and 4B, the solid line illustrates the transmission range in Cu; the single dot-dash line illustrates the transmission range in Si; and the broken line illustrates the transmission range in Al.

The transmission range in Si and the transmission range in Al are substantially the same for both protons and electrons. Accordingly, when Al is used as the material of the upper electrode 50, the protons or the electrons can be prevented from reaching the buried electrode part 30 by setting the film thickness of the second portion 52 located on the buried electrode part 30 to be equal to the depth to be reached by the protons or the electrons in the silicon layer 20.

The transmission range in Cu is less than the transmission range in Si for both protons and electrons. Accordingly, when Cu is used as the material of the upper electrode 50, the protons or the electrons can be prevented from reaching the buried electrode part 30 by using a second portion 52 that is thinner than when the upper electrode 50 is made of Al. For example, when the protons are to reach a depth of 8 μm in the silicon layer 20, from the graph of FIG. 4A, the film thickness of the second portion 52 of Cu can be set to about 4 μm.

Figure 5:
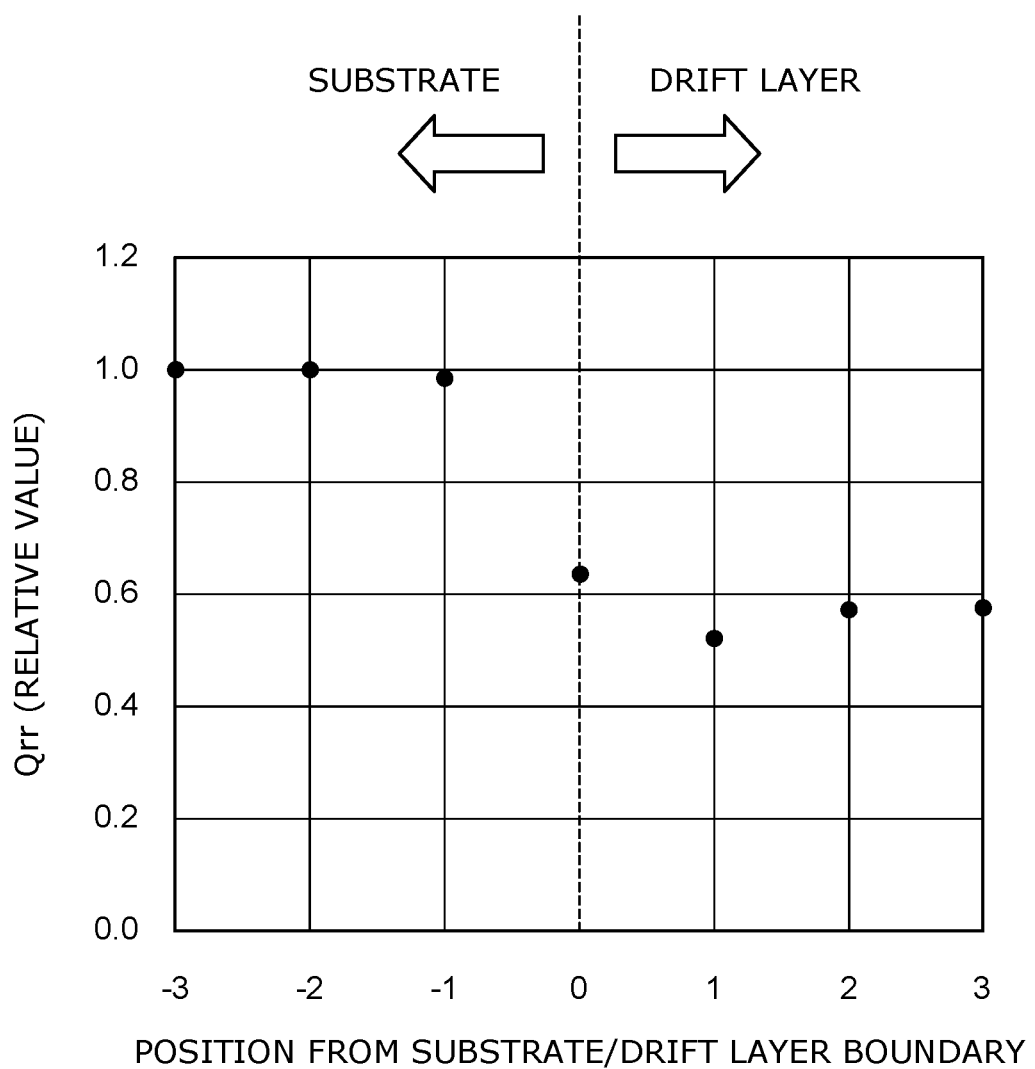
FIG. 5 is a graph illustrating simulation results of a dependence of a reverse recovery charge Qrr on a position in a vertical direction of a lifetime control region.

FIG. 5 is a graph illustrating simulation results of the dependence of the reverse recovery charge Qrr on the position in the vertical direction of the lifetime control region. The calculations were performed for a width of the lifetime control region of 0.5 corresponding to FIG. 2.

The horizontal axis of the graph of FIG. 5 is the position of the lifetime control region when the boundary between the substrate 10 and the drift layer 11 is used as a reference (0). The positive direction is the drift layer 11 side; and the negative direction is the substrate 10 side. The vertical axis is a relative value when Qrr is taken to be 1.0 when the energy level is not formed.

In the graph of FIG. 5, the reduction effect of Qrr is apparent when the lifetime control region is formed in the positive direction when referenced to the boundary between the substrate 10 and the drift layer 11, that is, the drift layer 11 side. That is, the reverse recovery characteristics of the built-in diode are improved by forming the energy level (the lifetime killer) in the region that includes the drift layer 11.

The depletion layer that extends in the drift layer 11 may cause a leakage current that is generated in the off-state of the MOSFET operation part if the depletion layer reaches the energy level (the lifetime killer). Therefore, it is desirable for the energetic particles to reach a depth in the drift layer 11 that is not reached by the depletion layer extending in the drift layer 11.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A semiconductor device, comprising:
   an upper electrode;
   a lower electrode;
   a n-type substrate positioned between the upper electrode and the lower electrode;
   a buried electrode part positioned between the substrate and the upper electrode, the buried electrode part including a gate electrode; and
   a silicon layer positioned between the substrate and the upper electrode,
   the silicon layer including
   a mesa part next to the buried electrode part, and
   a n-type drift layer being in direct contact with the n-type substrate, the drift layer including a first region positioned between the mesa part and the substrate, and a second region positioned between the buried electrode part and the substrate,
   the first region and the second region being continuous in a direction in which the buried electrode part and the mesa part are next to each other,
   an energy level density of the first region being greater than an energy level density of the second region, and
   a peak of an energy level density of the drift layer being located in the first region.

2. The device according to claim 1, wherein a crystal defect density of the first region is greater than a crystal defect density of the second region.

3. The device according to claim 1, wherein a hydrogen concentration of the first region is greater than a hydrogen concentration of the second region.

4. The device according to claim 1, wherein a plurality of the buried electrode parts and a plurality of the mesa parts extend in stripe shapes.

5. The device according to claim 1, wherein the buried electrode part includes a field plate electrode electrically connected with the upper electrode or the gate electrode.

6. The device according to claim 1, wherein the upper electrode contacts the mesa part.

* * * * *